United States Patent [19]

Tanaka et al.

[11] 4,201,598
[45] May 6, 1980

[54] ELECTRON IRRADIATION PROCESS OF GLASS PASSIVATED SEMICONDUCTOR DEVICES FOR IMPROVED REVERSE CHARACTERISTICS

[75] Inventors: Tomoyuki Tanaka; Toshikatsu Shirasawa; Masahiro Okamura, all of Hitachi, Japan

[73] Assignee: Hitachi, Ltd., Japan

[21] Appl. No.: 820,698

[22] Filed: Aug. 1, 1977

[30] Foreign Application Priority Data

Aug. 11, 1976 [JP] Japan .................................. 51-95855

[51] Int. Cl.$^2$ ...................... H01L 7/54; H01L 21/263
[52] U.S. Cl. .................................. 148/1.5; 357/29; 357/72; 357/91; 427/35
[58] Field of Search ...................... 148/1.5; 357/72, 29, 357/91; 427/35

[56] References Cited

U.S. PATENT DOCUMENTS

| 3,505,571 | 4/1970 | Volder | 317/234 |
|---|---|---|---|
| 3,674,520 | 7/1972 | Suzuki et al. | 106/54 |
| 3,752,701 | 8/1973 | Morrissey | 117/201 |
| 3,837,002 | 9/1974 | Sakamoto et al. | 357/72 |
| 3,881,964 | 5/1975 | Cresswell et al. | 148/1.5 |
| 3,933,527 | 1/1976 | Tarneja et al. | 148/1.5 |
| 3,996,602 | 12/1976 | Goldberg et al. | 357/72 |

FOREIGN PATENT DOCUMENTS 2517743   4/1976   Fed. Rep. of Germany ............. 357/73

*Primary Examiner*—L. Dewayne Rutledge
*Assistant Examiner*—Upendra Roy
*Attorney, Agent, or Firm*—Craig and Antonelli

[57] ABSTRACT

Semiconductor devices with improved reverse characteristics are obtained by exposing the semiconductor bodies of the devices that are passivated by alkali-free glasses to a high energy radiation such as an electron radiation so as to shorten a life time of the bodies down to a predetermined value, while increasing the reverse leakage current of the bodies, and by subjecting the irradiated semiconductor bodies to an annealing treatment at a temperature of 250° to 350° C. for a sufficient time so as to decrease the reverse leakage current down to a predetermined value, while maintaining the order of the shortened life time.

9 Claims, 5 Drawing Figures

ELECTRON IRRADIATION PROCESS OF GLASS PASSIVATED SEMICONDUCTOR DEVICES FOR IMPROVED REVERSE CHARACTERISTICS

BACKGROUND OF THE INVENTION

The present invention relates to a process for manufacturing a semiconductor device having a glass coating on the surface of a p-n junction formed in a semiconductor body of the device, and more particularly to a process for manufacturing a semiconductor device with improved reverse characteristics.

It is well known in the art that in order to perform a high speed switching operation of semiconductor devices such as diodes, transistors, and thyristors, carrier life time of the devices must be made small and that the life time can be shortened by forming recombination centers in semiconductor bodies of the devices. The recombination centers are formed by doping heavy metal atoms such as gold in the bodies or by irradiating the semiconductor bodies with radiation rays or beams to cause lattice defects therein. Since the irradiation method as disclosed in U.S. Pat. Nos. 3,852,612; 3,888,701; 3,809,582, and 3,872,493 has a number of advantages over the doping method, there is a tendency to increase the use of the former method.

On the other hand, the demand for semiconductor devices having high blocking voltages and reliability is increasing, and to this end, the surface of a p-n junction exposed to the surface of a semiconductor body is often passivated by alkali-free glass as disclosed in U.S. Pat. Nos. 3,486,871; 3,551,171; 3,778,242; 3,650,778; 3,752,701; 3,505,571; and 3,674,520. According to experiments by the inventors, it has been revealed that when semiconductor devices passivated by the glass are irradiated by an electron beam, the reverse leakage current of the p-n junction with the glass layer increases remarkably, while there has been observed only a moderate increase in the leakage current when the surface is passivated by resins or varnishes. Because of the increase in the reverse leakage current, heat generation in the blocked state of the device makes it difficult to keep the blocked state and brings about such inconveniences as an increase in the power loss and malfunctions of the devices as well.

SUMMARY OF THE INVENTION

Accordingly, it is an object of the present invention to provide a method of manufacturing semiconductor devices passivated with a glass layer, which have improved reverse characteristics.

The process for manufacturing a semiconductor device of the present invention is characterized in that a glass layer for passivating the surface of a p-n junction exposed on the surface of a semiconductor body is irradiated by a radiation source to shorten the life time down to a predetermined value and then the semiconductor body and the glass layer are subjected to annealing at a temperature of 250° to 350° C. for a period of time sufficient to reduce a reverse leakage current having increased in the irradiation step down to a value smaller than the increased leakage current, while maintaining the degree of the life time shortened in the irradiation step. Preferably, increased leakage current should be reduced by the annealing to the same order of the leakage current value as measured before the irradiation.

The present invention will now be described in detail taken in conjunction with the accompanying drawings in which:

DETAILED DESCRIPTION OF PREFERRED EMBODIMENTS

Figure 1:
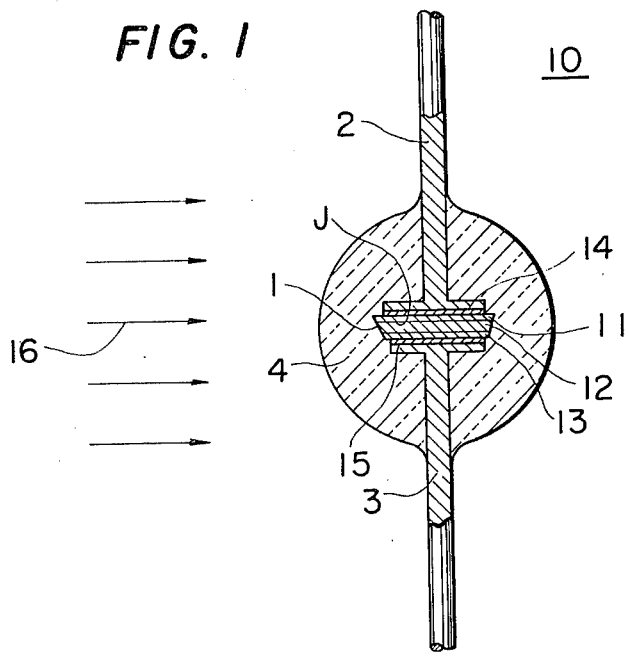
FIG. 1 is a sectional view of a silicon diode passivated with a glass layer in the step of irradiation with radiant rays.

Radiation rays or beams include electron beams, proton beams, neutron beams α-rays, γ-rays, β-rays, etc. as disclosed in the U.S. Pat. Nos. 3,852,612; 3,888,701; 3,809,582; and 3,872,493. Of these radiation beams and rays, preferable are electron beams from the practical point of view.

As the conditions for the irradiation are substantially the same as those employed in the conventional process such as disclosed in U.S. Pat. No. 3,872,493, detailed description of the conditions will be omitted to avoid superfluousness.

When an electron beam is employed, the minimum value of energy thereof which is necessary for causing lattice defects of the simple Frenkel type within the semiconductor body (Si) is about 0.5 MeV, and the minimum energy in case where the semiconductor body is irradiated indirectly with the electron beam through a glass layer, an electrode layer, a casing for the body, etc. is about 1 to 3 MeV or above.

The minimum dose of irradiation varies in dependence on a desired life time value, and it is generally above the order of $10^{13}$ electrons/cm$^2$. Preferably, desired lifetime value is less than 50% of the value measured before the irradiation. If the value of exposure exceeds the order of $10^{16}$ electrons/cm$^2$, the semiconductor body is too much irradiated, whereby a voltage drop in the conductive state of the device becomes very large such as 5 volts. Such a large voltage drop is not tolerable to practical use. Accordingly, the practical range of exposure is on the order of $10^{13}$ to $10^{16}$ electrons/cm$^2$.

Semiconductor devices to be subjected to the irradiation are prepared by the conventional methods including the doping and passivation steps. In the present invention, the passivation is performed with a glass which is free of alkali atom ions and has a coefficient of linear thermal expansion approximate to that of the semiconductor body employed. A variety of glass compositions for use in passivation of semiconductor bodies have been proposed and are disclosed in U.S. Pat. Nos. 3,486,871; 3,551,171; 3,778,242; 3,650,778; 3,752,701 and 3,674,520. Typical glass compositions useful as a passivating glass layer for the devices of the present invention are (1) a $ZnO-B_2O_3-SiO_2$ system, (2) a $B_2O_3-PbO-SiO_2$ system, and (3) a $ZnO-B_2O_3-SiO_2-PbO$ system. The glass compositions are selected to have a coefficient of linear thermal expansion of about $100\times10^{-7}/°C$. or less, preferably $80\times10^{-7}/°C$. or less over a temperature range of 100° to 350° C. Of the conventional alkali-free glasses, preferable compositions are shown as follows:

| (1) | ZnO | 63% by weight |
|---|---|---|
| | $B_2O_3$ | 20 by weight |
| | $SiO_2$ | 9.4 by weight |
| | PbO | 4.3 by weight |
| | $Sb_2O_3$ | 0.5 by weight |
| | $SnO_2$ | 1.2 by weight |
| | $Al_2O_3$ | 0.09 by weight |
| (2) | ZnO | 62% by weight |
| | $B_2O_3$ | 20 by weight |
| | $SiO_2$ | 9.5 by weight |
| | $SnO_2$ | 0.7 by weight |
| | PbO | 2.8 by weight |
| | $Sb_2O_3$ | 1.5 by weight |
| | $Al_2O_3$ | 0.1 by weight |
| (3) | ZnO | 54% by weight |
| | $B_2O_3$ | 16 by weight |
| | $SiO_2$ | 7.8 by weight |
| | $SnO_2$ | 1.1 by weight |
| | PbO | 4.3 by weight |
| | $Sb_2O_3$ | 0.4 by weight |
| | $PbTiO_3$ | 12.3 by weight |

Preferable glasses may be chosen within the following composition:

| ZnO | 50 to 80% by weight |
|---|---|
| $B_2O_3$ | 5 to 30% by weight |
| $SiO_2$ | 1 to 10% by weight |
| PbO | up to 10% by weight |
| $Sb_2O_3$ | up to 5% by weight |
| $SnO_2$ | up to 5% by weight |
| $Al_2O_3$ | up to 5% by weight |

Description will be made of annealing conditions suitable for glass passivated semiconductor devices having been subjected to such irradiation. In general, crystal defects caused in a semiconductor body by the irradiation with radiant rays or beams may be recovered by a heat treatment, i.e., annealing. Accordingly, when the semiconductor device subjected to the irradiation by the electron radiation is heat-treated at a high temperature, the recombination centers caused by the irradiation will be annihilated, so that the lift time of the device will become long. According to experiments by the inventors, however, it has been found that the reverse leakage current of a glass-passivated semiconductor device at the p-n junction as increased by the irradiation with the electron radiation can be made small when the device is annealed at a temperature of 250° C. for 0.5 hour and may return to a small current value observed before the irradiation, while an undesirable increase in the life time takes place. The relation between the heat-treatment temperature and time which bring forth the same annealing effect is inversely proportional, and by way of example, a heat treatment of 300° C. for 2 hours is equivalent to a heat treatment of 350° C. for about 0.5 hour. Accordingly, preferable heat-treatment conditions are lower than equivalence to 350° C. for 0.5 hour, but higher than equivalence to 350° C. for 0.1 hour, and higher than equivalence to 250° C. for 0.5 hour, but lower than equivalence to 250° C. for 50 hours. A more desirable heat treatment is performed under conditions above equivalence to 250° C. for 0.5 to 20 hours at which leakage current is substantially reduced, and below equivalence to 350° C. for 0.5 to 0.1 hours. Accordingly, the annealing is carried out under the conditions defined by the temperature range and time range, i.e. 250° C. for 0.5 to 50 hours to 350° C. for 0.1 to 0.5 hour.

FIG. 1 is a drawing which shows a section of a glass mold type diode according to an embodiment of this invention. The diode 10 consists of a silicon pellet 1, an anode lead 2, a cathode lead 3, and a glass insulator 4 for passivating and protecting the silicon pellet 1. The silicon pellet 1 consists of a p+ diffused layer 11, an n-type high resistivity layer 12, an n+ diffused layer 13, and metal contacts 14, 15 of p+ and n+ layers. A p-n junction J is formed between the p+ diffused layer 11 and the n-type high resistivity layer 12. Such device is fabricated in the way stated below. Boron and phosphorus are successively diffused into both the principal surfaces of an n-type silicon wafer having a resistivity of 30Ω.cm and a thickness of about 270 μm to respective amounts of about 70 μm, to form the p+ and n+ layers 11 and 13. Subsequently, aluminum (Al) is evaporated as the metal contacts 14, 15, whereupon the wafer is cut into pellets each with a diameter of 1.4 mm, and the anode lead 2 and the cathode lead 3 are respectively bonded to the opposite principal surfaces of the pellet 1. Further, the globular glass insulator 4 is formed around the pellet 1 as shown in FIG. 1. In the glass coating treatment, zinc borosilicate series glass of the following composition was employed:

TABLE

| Ingredients | Ingredient Ratios (% by weight) |
|---|---|
| ZnO | 63.1 |
| $B_2O_3$ | 20.47 |
| $SiO_2$ | 9.388 |
| PbO | 4.29 |
| $Sb_2O_3$ | 0.476 |
| $SnO_2$ | 1.23 |
| $Al_2O_3$ | 0.087 |

The glass material is powdered and dispersed into water to form a slurry and is deposited on the periphery of the pellet 1 and end parts of the leads 2, 3 as shown in the figure. Thereafter, the deposited glass slurry was baked to fuse, whereby the surface of the p-n junction of the device 10 is passivated, and at the same time, the pellet is protected against a mechanical damage.

Figure 2:
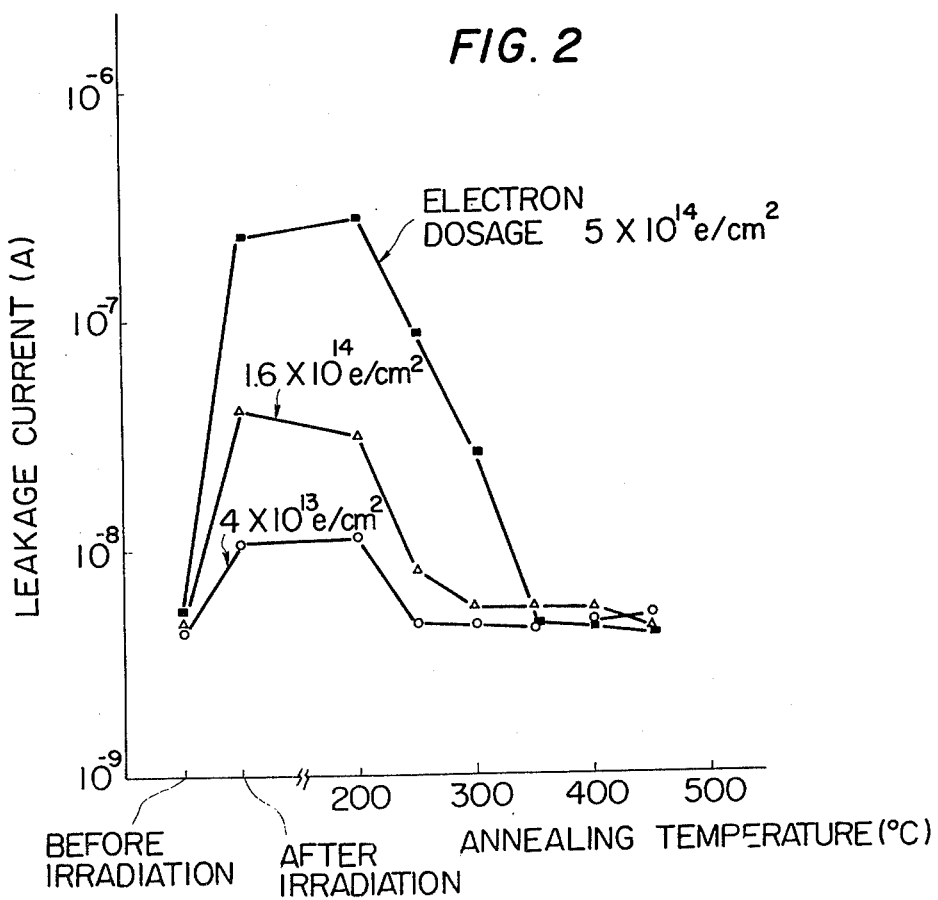
FIG. 2 is a graph showing the relationship between annealing temperature and leakage current.
Figure 3:
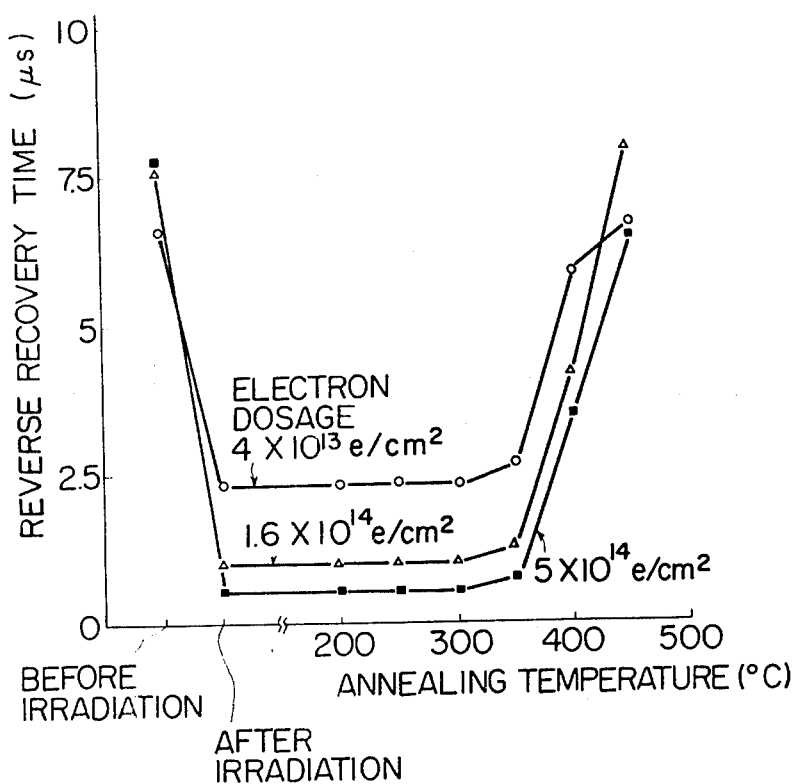
FIG. 3 is a graph showing the relationship between the annealing temperature and the reverse recovery time.

Subsequently, the device 10 is irradiated with electron radiation 16. In order to attain a uniform irradiation effect within the pellet 1, the energy of the election radiation was required to be about 2 MeV. Before the irradiation with the electron radiation, the leakage current of the device 10 was about $7\times10^{-9}$ A (reverse bias: 400 V), the "on" voltage was about 1.0 V (forward current: 4 A), the recovery time in the reverse direction was about 7 μs, the life time of carriers was about 8 μs, and the blocking voltage was about 900 V, respectively. When the device 10 was subjected to the irradiation with electron radiation of an energy of 2 MeV and of the level of the irradiation dosage of $4\times10^{13}$ to $5\times10^{14}$ electrons/cm$^2$, the life time of carriers and the recovery time in the reverse direction were shortened as expected, but the leakage current increased as unexpectedly as 100 times at the maximum. FIGS. 2 and 3 show the results of an isochronal annealing of 0.5 hr as to the samples. As is apparent from both the figures, the recovery time in the reverse direction is shortened to $\frac{1}{5}$-1/15 of the value prior to the irradiation in accordance with the dosage level after the electron irradiation. Although the effect of irradiation may be eliminated by a heat treatment above 450° C. for 0.5 hour, the shortened life times cannot be maintained unless the annealing is carried out at 350° C. or below. Although not shown in the drawing, it has been confirmed that the life time of carriers exhibits quite the same tendency as that of the recovery time in the reverse direction. On the other hand, the leakage current begins to recover by a heat treatment above 200° C., but such a relatively low temperature annealing requires a very long time to obtain desired results. Therefore, an annealing of 250° C. for 0.5 hour is preferably chosen in case of, for example, the irradiation of $4 \times 10^{13}$ electrons/cm$^2$. In a case where an electron dosage of irradiation is large, annealing conditions under which the leakage current begins to decrease again are substantially the same. However, in case of the irradiation dosage of $5 \times 10^{14}$ electrons/cm$^2$, the leakage current is decreased by the heat treatment of 350° C. for 0.5 hour without increasing the shortened lift time of the device. According to the combination of the irradiation and annealing, there is obtained the diode device 10 which has a shortened life time of carriers as determined by the conditions of the irradiation and a short recovery time characteristic and which has a small leakage current recovered to the same level as that measured before the irradiation.

Figure 4:
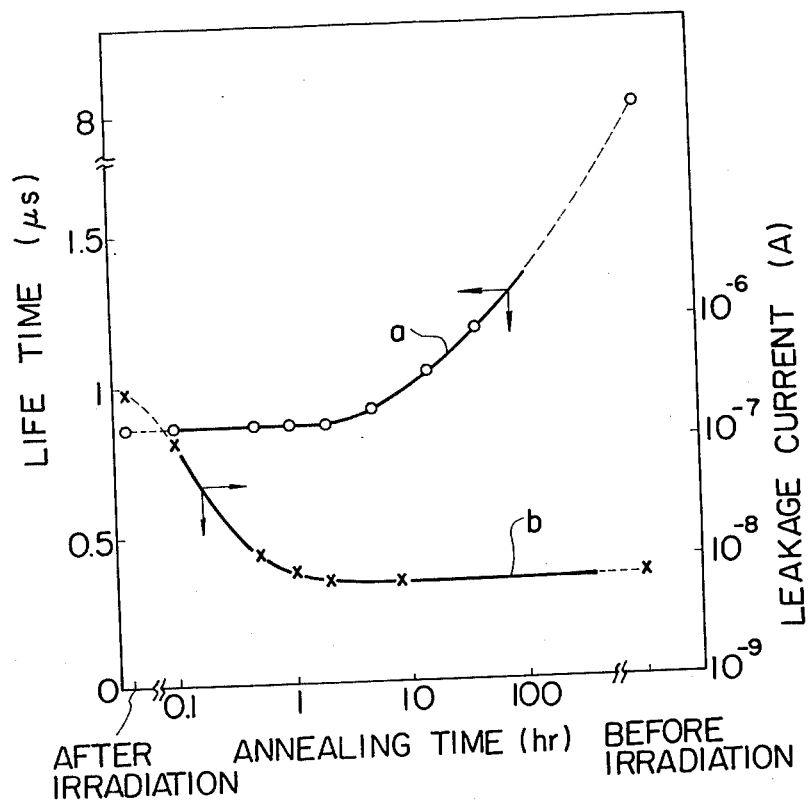
FIG. 4 is a graph showing the relationship between annealing time and carrier life time and reverse leakage current.
Figure 5:
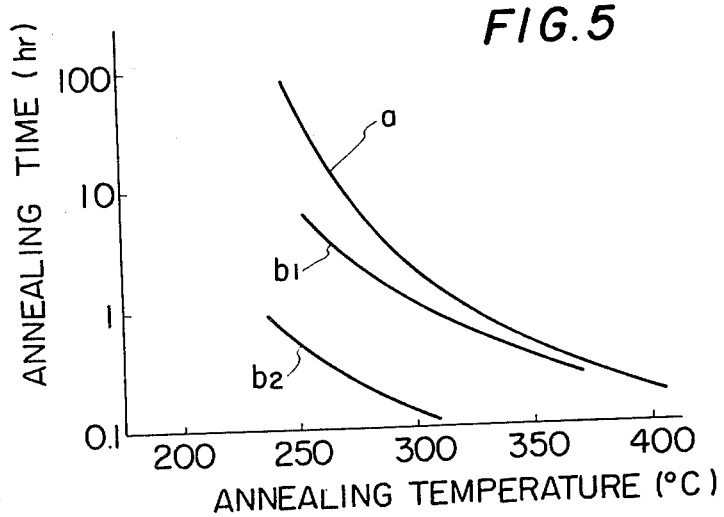
FIG. 5 is a graph showing the relationship between annealing time and annealing temperature.

FIG. 4 shows results at the time when the device 10 of FIG. 1 was subjected to the irradiation with electron radiation of an energy of 2 MeV and an electron dosage of $4 \times 10^{14}$ electrons/cm$^2$ and then to annealing at 300° C. In the figure, a curve a represents the life time, and a curve b the leakage current in the reverse direction. While the life time begins to increase again after the annealing for above 5 hours at last, the leakage current begins to become small only after the annealing for 0.1 hour and becomes a value measured before the irradiation when the annealing is carried out for 2 hours. FIG. 5 is a graph which shows the relationship between the annealing time and the annealing temperature. A curve a, which corresponds to an irradiation dosage of a range from $1 \times 10^{13}$ to $1 \times 10^{16}$ electrons/cm$^2$, represents the upper limit for the annealing conditions above which undesirable annealing effects begin to appear in the life time and the reverse recovery time irrespective of the irradiation dosage, while curves $b_1$ and $b_2$ represent the lower limit for the annealing conditions which are necessary to reduce the leakage current to the value measured before the irradiation. Curve $b_1$ and curve $b_2$ correspond to an irradiation dosage of $5 \times 10^{14}$ electrons/cm$^2$ and to an irradiation dosage of $4 \times 10^{13}$ electrons/cm$^2$, respectively. Annealing conditions lying between the curve a and the curve $b_1$ or curve $b_2$ are the conditions under which, while holding the life time etc. at values measured immediately after the electron irradiation, the inconvenient increase of the leakage current attributed to the irradiation can be reduced. In a case where the dosage of irradiation is as large as, for example, $1 \times 10^{16}$ electrons/cm$^2$, curves $b_1$ and $b_2$ will agree with or go beyond the curve a, but even in that case, the leakage current is reduced by annealing to a level close to that before the irradiation under conditions below the curve a. Although, in the embodiment, only the glass-molded element has been mentioned, the effect has been confirmed as to a device with a glass layer formed only in the vicinity of the exposed surface of a p-n junction, and the scope of application of this invention is not restricted to the present embodiment.

As is apparent from the above detailed description, while the life time of carriers and the turn "off" characteristics such as the reverse recovery time of a diode thereby governed are maintained at desired values determined by the conditions of irradiation, the disadvantage of the irradiation can be removed. That is, the increased leakage current of a glass passivated semiconductor device can be reduced. Since the life time is not affected during the annealing of the specified conditions, the control of the life time is very easy with the features of the irradiation.

While the novel principles of the invention have been described, it will be understood that various omissions, modifications and changes in these principles may be made by one skilled in the art without departing from the spirit and scope of the invention.

We claim:

1. A process for manufacturing a semiconductor device having improved reverse characteristics comprising the steps of:
   (a) preparing a semiconductor assembly comprising a semiconductor body which has at least one p-n junction therein and first and second main surfaces at the both ends thereof, an edge face of the p-n junction being exposed to the body, and first and second electrodes each being in ohmic contact with the corresponding main surfaces,
   (b) forming a passivating coating of an alkali-free glass layer on the edge face to protect the body from mechanical damage thereto,
   (c) irradiating the semiconductor body through the coating to radiation rays sufficient to cause lattice defects in the body so as to shorten the life time of the minority carriers down to a predetermined value and to increase the reverse leak current at the p-n junction, and
   (d) annealing the semiconductor assembly after the irradiation, said annealing being carried out at an elevated temperature for a period of time sufficient to recover the electric characteristics damaged in the step of the irradiation, the annealing being carried out under such a condition that the increased reverse leak current is decreased to a predetermined value smaller than the increased value, while the degree of the shortened life time is substantially maintained during the annealing.

2. The process as defined in claim 1, wherein the glass layer has a coefficient of linear thermal expansion approximate to that of the semiconductor body.

3. The process as defined in claim 1, wherein the glass layer has the following composition:

| | |
|---|---|
| ZnO | 50 to 80% by weight |
| $B_2O_3$ | 5 to 30% by weight |
| $SiO_2$ | 1 to 10% by weight |
| PbO | up to 10% by weight |
| $Sb_2O_3$ | up to 5% by weight |
| $SnO_2$ | up to 5% by weight |
| $Al_2O_3$ | up to 5% by weight |

4. The process as defined in claim 1, wherein the annealing is carried out under the condition corresponding to a condition not less than 0.5 hour at 250° C. but not more than 0.5 hour at 350° C.

5. The process as defined in claim 1, wherein the exposure to radiation is an amount corresponding to $1 \times 10^{13}$ to $1 \times 10^{16}$ electrons/cm$^2$.

6. The process as defined in claim 1, wherein the annealing is carried out under the conditions defined by 250° C. for 0.5 to 50 hours to 350° C. for 0.1 to 0.5 hour.

7. A semiconductor device with shortened life time characteristics and improved reverse characteristics which comprises (1) a semiconductor body having at least one p-n junction therein exposed to a side face of the body and first and second main surfaces thereof at the opposite ends, (2) first and second electrodes being in ohmic contact with the first and second main surfaces, and (3) a glass coating for mechanically protecting the semiconductor body as well as passivating the edge face, wherein the glass coating in intimate contact with the edge face contains zinc oxide and boron oxide as main components but contain no atoms of alkali metals, the semiconductor body and the glass coating being subjected to irradiation through the coating to radiation rays sufficient to cause lattice defects in the body so as to shorten the life time of the minority carriers down to a predetermined value, and annealing at an elevated temperature for a period of time sufficient to recover the electric characteristics damaged in the step of the irradiation, the improvement that comprises employing as the coating an alkali-free glass layer, whereby a reverse leak current at the p-n junction is increased in the irradiation step, and the annealing is carried out under such condition so that the increased reverse leak current is decreased to a predetermined value smaller than the increased value, while the degree of the shortened life time is substantially maintained in the step of the annealing, whereby the reverse leak current is substantially reduced to a value smaller than that measured after the irradiation.

8. The semiconductor device as defined in claim 7, wherein the glass coating has the following composition:

| | |
|---|---|
| ZnO | 50 to 80% by weight |
| $B_2O_3$ | 5 to 30% by weight |
| $SiO_2$ | 1 to 10% by weight |
| PbO | up to 10% by weight |
| $Sb_2O_3$ | up to 5% by weight |
| $SnO_2$ | up to 5% by weight |
| $Al_2O_3$ | up to 5% by weight | and has a coefficient of linear thermal expansion approximately equal to that of the semiconductor body.

9. The semiconductor device as defined in claim 7, wherein the glass coating has a linear thermal expansion of not more than $100 \times 10^{-7}/°C$.

* * * * *